(12) United States Patent
Okuda et al.

(10) Patent No.: US 7,075,077 B2
(45) Date of Patent: Jul. 11, 2006

(54) METHOD OF OBSERVING A SPECIMEN USING A SCANNING ELECTRON MICROSCOPE

(75) Inventors: Hirohito Okuda, Yokohama (JP); Toshifumi Honda, Yokohama (JP); Kazuo Aoki, Hitachinaka (JP); Kohei Yamaguchi, Hitachinaka (JP); Masashi Sakamoto, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/020,265

(22) Filed: Dec. 27, 2004

(65) Prior Publication Data

US 2005/0194533 A1   Sep. 8, 2005

(30) Foreign Application Priority Data

Mar. 3, 2004   (JP) .............................. 2004-058452

(51) Int. Cl.
*H01J 37/21* (2006.01)
(52) U.S. Cl. ................. 250/310; 250/201.4; 250/201.2; 250/306; 250/310; 250/311
(58) Field of Classification Search ................. 250/310
See application file for complete search history.

(56) References Cited

U.S. PATENT DOCUMENTS

| 5,512,747 A * | 4/1996 | Maeda .................. 250/310 |
| 6,114,681 A * | 9/2000 | Komatsu ............... 250/201.3 |
| 6,838,667 B1 * | 1/2005 | Tsuneta et al. ......... 250/306 |

FOREIGN PATENT DOCUMENTS

| JP | 2002-124555 | 4/2002 |
| JP | 2003-098114 | 4/2003 |

* cited by examiner

*Primary Examiner*—Nikita Wells
*Assistant Examiner*—James Leybourne
(74) *Attorney, Agent, or Firm*—Antonelli, Terry, Stout and Kraus, LLP.

(57) ABSTRACT

A method of observing a specimen using a scanning electron microscope, makes it possible to shorten the time required to perform automatic focusing at the time of semiconductor defect automatic review and improves the throughput in the processing in which the specimen is observed. In the above method, the specimen is imaged at a low resolution by the scanning electron microscope to obtain an image, an area for imaging the specimen at a high resolution is specified from the image acquired at the low resolution, the specimen is imaged at a high resolution by the scanning electron microscope to determine a focus position, a focal point of the scanning electron microscope is set to the determined focus position, and a high resolution image in the specified area is acquired in a state in which the focus position has been set to the determined focus position.

7 Claims, 10 Drawing Sheets

METHOD OF OBSERVING A SPECIMEN USING A SCANNING ELECTRON MICROSCOPE

BACKGROUND OF THE INVENTION

The present invention relates to a method of observing a specimen using a scanning electron microscope for reviewing defects on the surfaces of a semiconductor electronic circuit substrate, a liquid crystal display substrate, etc.

With the objective of determining in detail each defect produced on a semiconductor electronic circuit substrate, automatic defect review (ADR: Automatic Defect Review) has been carried out for re-detecting an image at each defect position, detected by an optical inspecting device or an electron beam inspecting device, with high resolution by use of an electron beam microscope. The automatic defect review involves the collection of images of a large number of defects that are identified by the inspecting device automatically and at high speed.

As an example of such automatic defect review, reference is made, for example, to Japanese Patent Laid-open No. 2002-124555 and Japanese Patent Laid-open No. 2003-98114.

In the automatic defect review that is carried out using an electron beam microscope, much of the processing time is spent on automatic focusing. Thus, there has been a strong demand for shortening the time necessary for automatic focusing.

One example of an image detecting sequence that may be used during automatic defect review is shown in FIG. 8. In FIG. 8, reference numeral 80 indicates defect position data. Prior to the review, coordinate positions on a wafer, where respective defects have been detected by an optical or electron beam inspecting device, are inputted to a review electron beam microscope as the defect position data 80.

Next, a focus map creating process 81 is performed prior to the picking-up of images of the respective defects. A focus map is equivalent to one in which a wafer in-plane distribution of focus positions caused by warpage of a wafer surface and electrostatic charging of the surface or the like has been estimated. Focus positions are normally determined at a plurality of points (about several to ten points or more, which are not necessarily limited to defects) by manual control, and a curved surface sufficient to produce a good approximation of the result of measurement of the focus positions is estimated. By schematically estimating the focus positions in advance, the focus-position searching range at each defect position can be narrowed. As a result, the time required to perform the required focusing can be shortened. Thus, an improvement in the accuracy of estimation of each focus position using the focus map is important to the shortening of the automatic focusing time.

After the focus map has been determined, the stage carrying the specimen is moved to each position intended for detection (82), where image detection is performed. At the time of image detection, images are picked up at two types of resolution, including low and high resolutions. Further, images are picked up at two defect and reference points with respect to the respective resolutions. That is, the images of four types (low resolution reference, low resolution defect, high resolution reference and high resolution defect) are detected.

The reason why image detecting is performed at both low and high resolutions is as follows. The accuracy of defect position data outputted by the inspecting device might reach about 20 mm according to circumstances. In such a case, there is a need to detect an image with a wide field of view (at a low resolution) for the purpose of detecting a defect within a field of view. On the other hand, the wide-field (low resolution) image might often be insufficient or short in resolution as a review application. Therefore, two-stage imaging is carried out, which sufficiently picks up a wide-field low resolution image, detects a defect within a low resolution image field of view, specifies a defect position in this condition, and images the neighborhood of the defect position at a high resolution.

The reason why both defect and reference images are picked up is as follows. In addition to the defect image, each of the images at the same points of chips that are positioned adjacent to each other is detected as a reference image. Consequentially, a user is able to observe the defect image and the reference image by comparison and use the result to provide an understanding of a defect section. This can also be used in ADC (Automatic Defect Classification).

Returning to the description of FIG. 8, the picking up of the above-described four types of images is executed sequentially while the stage is being moved. That is, the stage is moved to a reference position (82), where a low resolution reference image is picked up (83). Next, the stage is moved (84) to detect a low resolution defect image. Then, a defect position in the corresponding low resolution image is specified based on the low resolution reference image and the low resolution defect image (86). The periphery of the specified defect position is imaged at a high resolution (87). Next, the stage is moved (88) to detect a reference high resolution image (89).

Now, focusing is performed every time, upon picking up the above-described four types of images. The contents of automatic focusing processing will be explained below the diagrams using 831, 832 and 833 in FIG. 8.

Upon automatic focusing at each point, an estimated value $Z_{est}$ of a focus position at each position to be detected is determined using the focus map (81) obtained in advance (831). Next, images at a different focus position are picked up while the focus position is being changed in the vicinity of the estimated value $Z_{est}$ (832). That is, images are sequentially picked up while the focus position is being changed to $Z_1, Z_2, Z_3, \ldots$ with $Z_1 < Z_2 < Z_3 \ldots < Z_{est} \ldots < Z_{n-2} < Z_{n-1} < Z_n$. Next, focus measures are calculated from the detected images. The focus measure is equivalent to an index obtained by quantifying focus matching. Various definitions are known therefor. A focus measure is normally defined in such a manner that the value thereof increases as it approaches a focused state. There is, for example, an amount obtained by integrating the intensities of the absolute values of differential operator's outputs over the entire image, etc. Reference numeral 833 indicates a result obtained by plotting focusing or focus measures determined with respect to the images picked up while the focus position is being changed. In the result 833, the position where the focus measure reaches the maximum can be regarded as a focus position.

The time necessary for automatic focusing at the time of image pickup is proportional to the number of pickups of images having a different focus position. Alternatively, the time is also proportional to the area of each image detection region. Thus, a reduction in the number of images to be picked up and a narrowing of the detection region are important to any shortening of the automatic focusing time.

SUMMARY OF THE INVENTION

It is an object of the present invention to provide a method of observing a specimen, using a scanning electron microscope, to make it possible the time necessary for automatic focusing at the time of semiconductor defect automatic review using an electron beam microscope, and of improving the throughput of the process in which the specimen is being observed.

The present invention provides a method of observing a specimen using a scanning electron microscope. In the method, the specimen is imaged at a low resolution by the scanning electron microscope to obtain an image, an area for imaging the specimen at a high resolution is specified from the image acquired at the low resolution, the specimen is imaged at a high resolution by the scanning electron microscope to determine a focus position, a focal point of the scanning electron microscope is set to the determined focus position, and a high resolution image in the specified area is acquired in a state in which the focus position has been set to the determined focus position.

Also, the present invention provides a method of observing a specimen using a scanning electron microscope. In the method, the specimen is imaged at a low resolution by the scanning electron microscope to acquire an image, a focusing area at the time of imaging the specimen at a high resolution is specified from the image acquired at the low resolution, the specified area is imaged by the scanning electron microscope to determine a focus position, a focal point of the scanning electron microscope is set to the determined focus position, and a high resolution image of the specimen is acquired by the scanning electron microscope in a state in which the focus position is set to the determined focus position.

Further, the present invention provides a method of observing a specimen using a scanning electron microscope. In the method, a focus position of the scanning electron microscope is measured at a plurality of points on the specimen to determine a distribution of focus positions within the plane of the specimen, a focus position at a desired observation position on the specimen is estimated on the basis of information concerning the determined distribution of focus positions within the plane of the specimen, a plurality of images having a different focus position, inclusive of the estimated focus position, are acquired while changing the focus position of the scanning electron microscope at the desired observation position on the specimen, the corresponding focus position of the desired observation position is determined from the acquired plural images having a different focus position, the distribution is corrected on the basis of information concerning the determined focus position at the desired observation position and the specimen is observed in a state in which the focus position at the desired observation position, of the scanning electron microscope is aligned with the determined focus position.

According to the present invention, the time required to perform automatic focusing at the time of semiconductor defect automatic review using an electron beam microscope can be shortened, and the throughput in the process in which a specimen is observed can be improved.

These and other objects, features and advantages of the invention will be apparent from the following more particular description of preferred embodiments of the invention, as illustrated in the accompanying drawings.

DETAILED DESCRIPTION OF THE PREFERRED EMBODIMENTS

The present invention will be described hereafter in detail with reference to the accompanying drawings.

Figure 1:
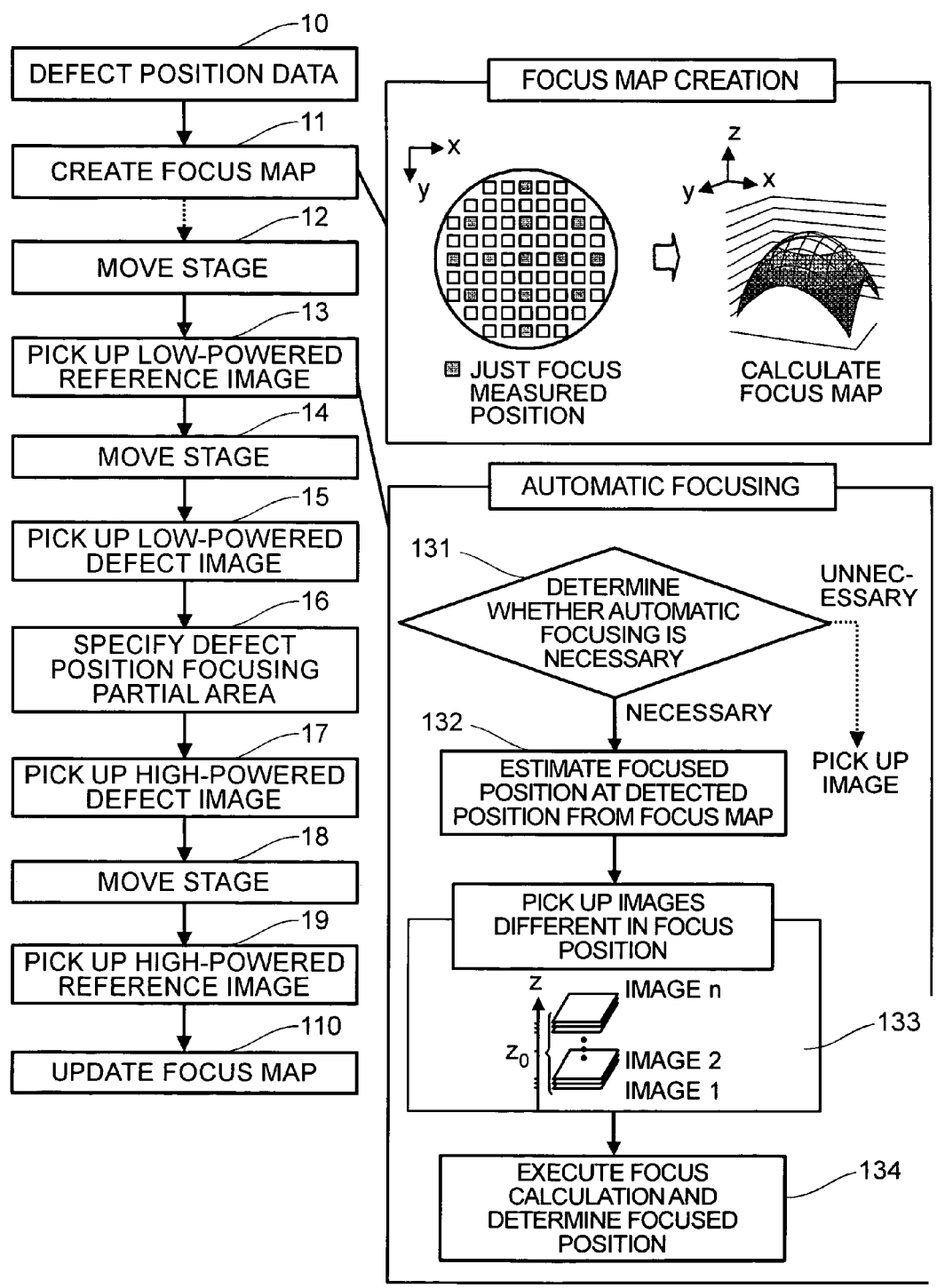
FIG. 1 is a flow diagram showing a sequence of steps for observing a specimen according to an embodiment of the present invention.

FIG. 1 shows an image pickup sequence for use in carrying out an automatic defect review according to the present invention.

In FIG. 1, reference numeral 10 indicates defect position data. Prior to the review, coordinate positions on a wafer, where respective defects have been detected by an optical or electron beam inspecting device, are inputted to a review electron beam microscope as the defect position data 10.

Next, a focus map creating process 11 is performed prior to the picking-up of images of the respective defects. Focus positions are determined or measured at a plurality of points (about several to ten points or more, which are not necessarily limited to defects) by manual control, and a curved surface sufficient to produce a good approximation of the result of measurement of the focus positions is estimated. This can be mathematically formulated in the following manner, for example. First, consider where points for focus map creation are defined as $(X_i, Y_i)$ (where i=1, N) and the focus positions at the respective points are defined as $H_i$. Next, assuming that a secondary function model given by, for example, (the following mathematical expression 1) is expressed as an in-plane distribution of the focus positions, such parameters a, b and c as will minimize a square error given by (the following mathematical expression 2) can be determined by a least squares method.

$$f(x, y) = ax^2 + by^2 + c \qquad (1)$$

$$E = \sum_{i=1...N} \{f(x_i, y_i) - H_i\}^2 \to \min \qquad (2)$$

Referring again to FIG. 1, after determination of the focus map, the stage is moved to each position intended for detection (12), and a low resolution image is detected (13). A case will be considered in which, when the low resolution image is picked up or imaged, there is no need to sequentially effect automatic focusing on all the positions intended for detection. If automatically focused points actually exist in the vicinity of the positions intended for detection, then the result of measurement of the focus positions at the already-measured points can be adjusted.

Thus, it is determined whether or not automatic focusing is necessary for each position intended for detection (131).

Figure 2:
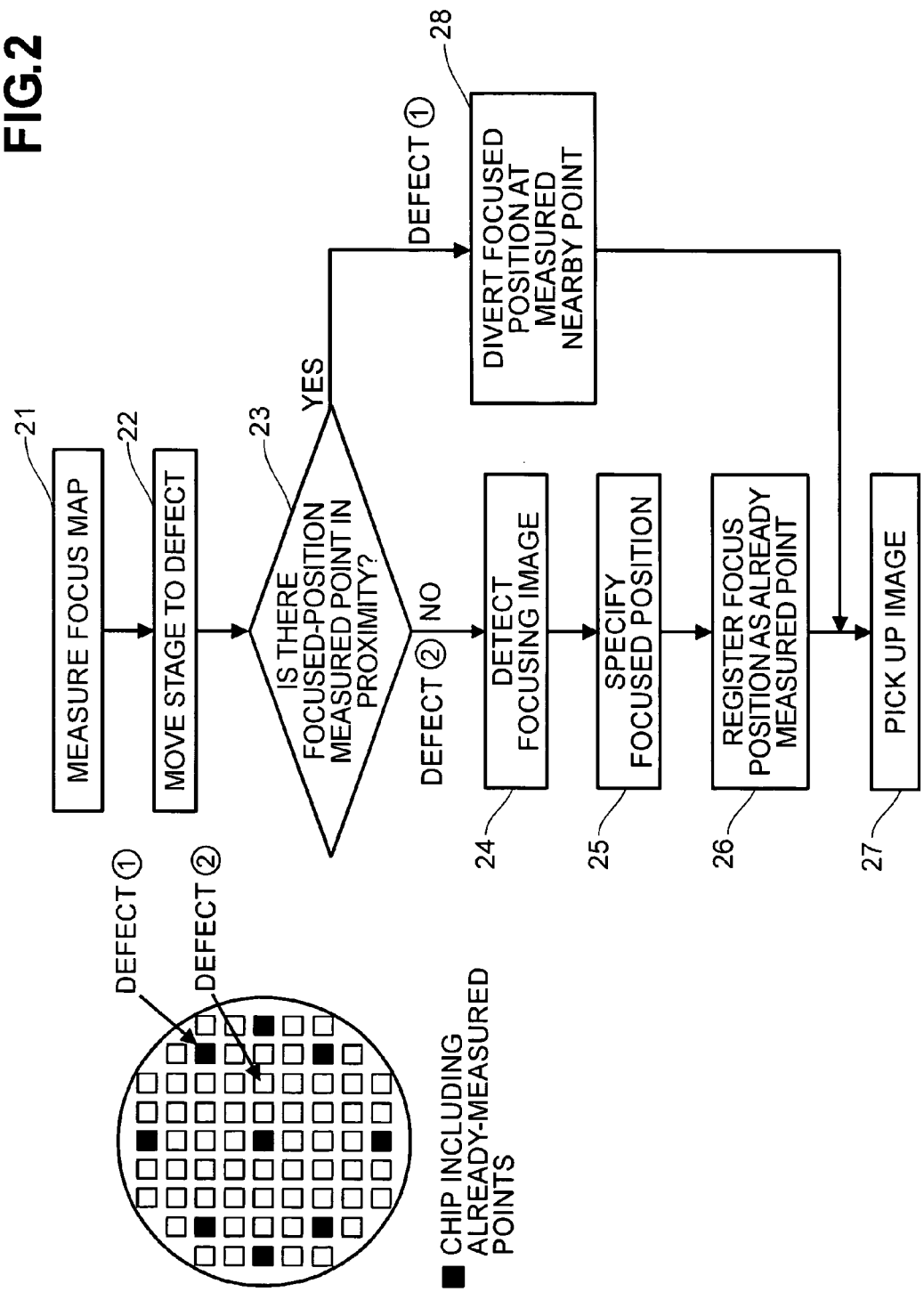
FIG. 2 is a flow diagram showing the procedure for determining whether automatic focusing is required.

A description will be made of the decision to determine whether automatic focusing is necessary, with reference to FIG. 2. The premise for the processing is based on the fact that detecting points located at in positions that are close to each other in the horizontal direction become close even to the required focus positions.

The stage is moved to positions intended for detection (Step 22). Prior to the decision concerning automatic focusing, a decision is made as to whether points, wherein focus positions were already measured, exist in the vicinity thereof. For example, the decision is made as follows. The focus positions at the focus-position measured points (xi, yi)(where i=1 ... N) are expressed as values Hi. Also, Thx and Thy are respectively defined as threshold values related to distances given by a user. If a focus-position measured point (xi, yi) that meets |x−xi|<Thx and |y−yi|<Thy as to this measured position (x, y) exists at this time, then the focus position Hi at the point (xi, yi) is regarded as the focus position at this measured position (x, y). If a number of measured points exists nearby in plural form, then the average value of focus position values Hi at the respective points may be used. Alternatively, the focus position at the point closest to this measured position (x, y) may be used.

When no focus-position measured points exist nearby, focusing is executed. That is, a focusing image is detected (24), the corresponding focus position is specified (25), and the focus position is registered as the focus-position measured point together with its position information (26). On the other hand, when a corresponding focus-position measured point exists nearby, the focus position at the measured point is used as a focus position at this imaging or image detecting position.

Referring again to the description of FIG. 1, when it is found at the decision 131 that automatic focusing is necessary, the focusing is executed. A focus position at this detecting point is estimated using the focus map (132). An estimated value is defined as $Z_{est}$. While the focus position is being changed in the vicinity of the estimated value $Z_{est}$, images different in focus position are next picked up (133). That is, images are sequentially picked up while the focus position is being changed to $Z_1$, $Z_2$, $Z_3$, . . . with $Z_1 < Z_2 < Z_3$ . . . $< Z_{est}$ . . . $< Z_{n-2} < Z_{n-1} < Z_n$. Next, focus measures are calculated from the detected images and the focus position is estimated based on the calculated focus measures (134).

Figure 5:
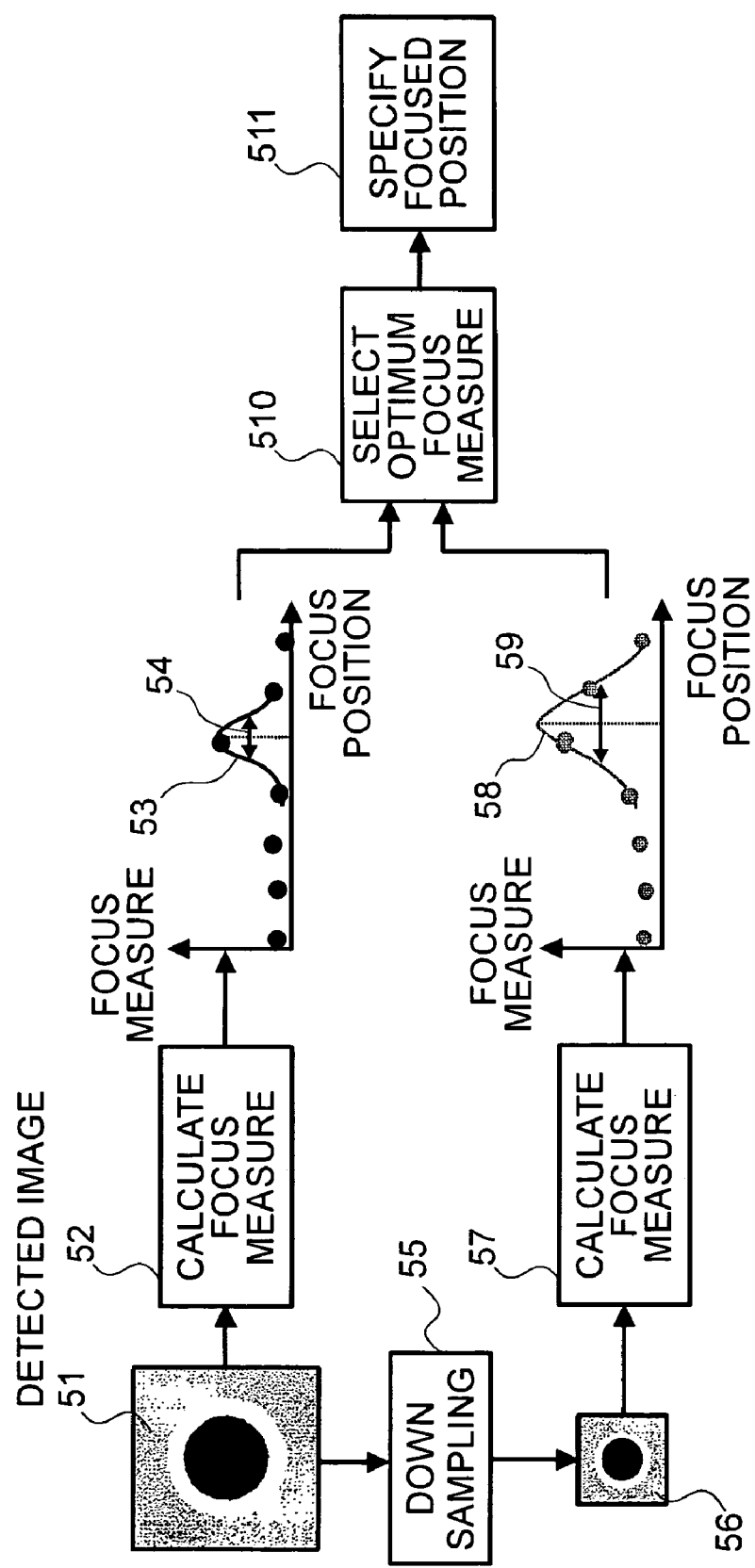
FIG. 5 is a flow diagram showing the flow of a process for performing focusing in combination with a plurality of focus measures.
Figure 9:
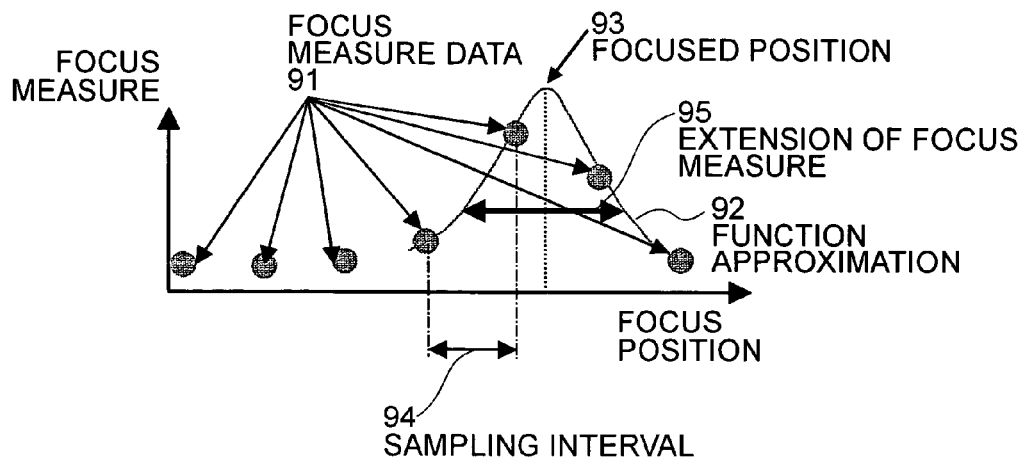
FIG. 9 is a graph showing the relationship between a focus measure and a focus position.

A method of estimating focus positions will be described with reference to FIGS. 5 and 9. The point of the estimating method resides in the fact that each focus position is estimated from detected images smaller than those obtained in the case of a use of the single focus measure by a combination of a plurality of focus measures that are different in characteristic.

Prior to this description, the relationship between sampling intervals between images, which are necessary to estimate a focus position, and an extension of a focus measure friction will be described with reference to FIG. 9. In a generally known focus position estimating method, focus measure data 91, obtained from images obtained at different focus positions, is made approximate by a function model, such as a Gaussian function, a secondary function or the like (92), and a peak position of such an approximation function is defined as a focus position 93. In order to make a good approximation of the focus measure using the function model and to estimate the corresponding focus position with satisfactory accuracy, there is a need to sufficiently make the sampling interval 94 between the focus measure data dense relative to an extension 95 of the focus measure function.

Meanwhile, the extension of the focus measure function changes depending on the frequency components of the detected images. More specifically, there is a tendency that the width of the focus measure function of a pattern which has high frequency components is narrow, and the width of the focus measure function of a pattern which is low frequency components becomes wide. Thus, the pattern which has high frequency components requires sampling intervals that are close together so as to pick up a large number of images. The case in which the extension of the focus measure function changes depending on the frequency characteristic used for calculation of each focus measure will be explained with reference to FIG. 5. For example, the sum on the screen, of the absolute values of the differential operator outputs is assumed as a focus measure (no limitation is imposed on it in particular). At this time, an extension 59 of a focus measure function 58 obtained by calculation (57) from an image (56) obtained by down-sampling (55) a detected image 51 is wider than the extension 54 of a focus measure function 53 obtained direct calculation (52) from the detected image 51.

A focus position calculating method according to the present invention will be explained in light of the foregoing discussion with reference to FIG. 5. A focus measure function 53 is calculated from a detected image 51. On the other hand, the detected image 51 is down-sampled to form an image 56 and a focus measure function 58 is calculated from the formed image 56. As mentioned above, the focus measure function 53 is narrower in its extension 54 than the focus measure function 58. Next, the optimum focus measure is selected using a focus-position calculation (510).

Figure 10:
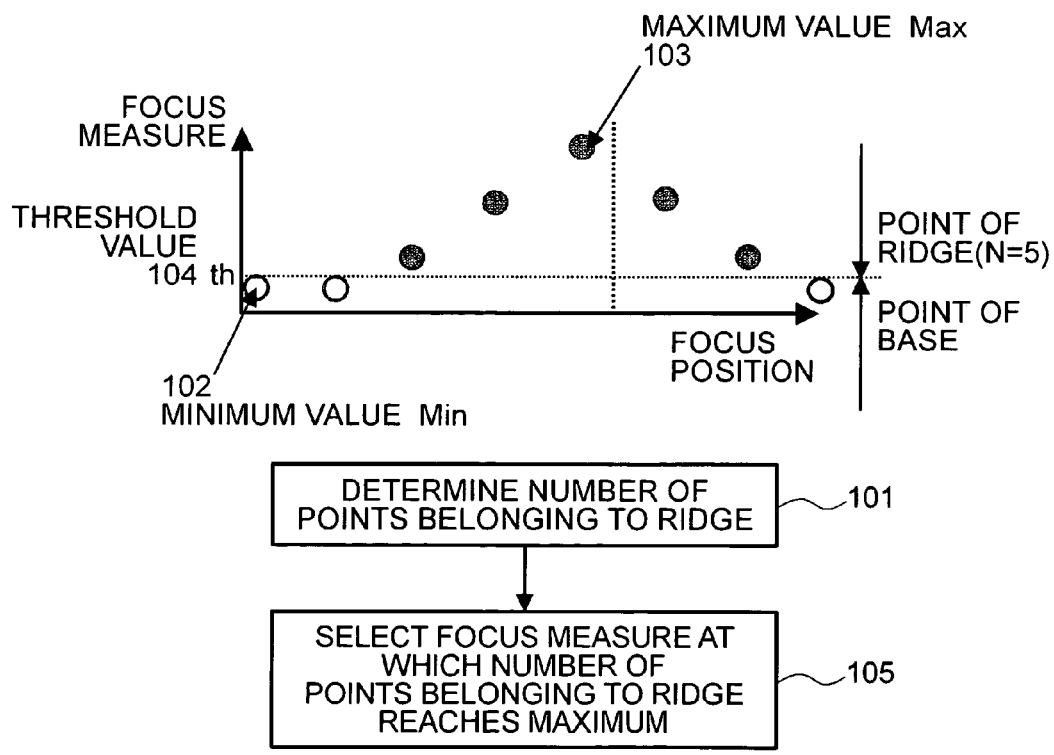
FIG. 10 is a graph showing the relationship between a focus measure and a focus position.

A method of selecting the optimum focus measure will be explained with reference to FIG. 10. To determine the optimum focus measure, sampling points are disposed so as to capture or grasp the shapes of the focus measure functions satisfactorily with respect to the focus measures. The function approximation of the focus measures, which has been described with reference to FIG. 9, can be carried out with satisfactory accuracy. As a result, it can be said that the utilization of the focus measures is proper where the focus position can be estimated with satisfactory accuracy. Thus, it is necessary to make a decision as to the optimality of each focus measure in terms of how the sampling points capture the whole shape of the focus measure function. In the method illustrated in FIG. 10, the corresponding focus measure, at which the number of points included in the ridge section of the focus measure function reaches the maximum, is selected on the basis of the concept that the shape can be made approximate satisfactorily inasmuch as the ridge section of the focus measure function is sampled at more points. First, the number of points belonging to the ridge, excluding the points that belong to a base, is determined in the respective focus measures at step 101. Assuming that the minimum value (102) of the focus measure function is defined as Min, the maximum value (103) thereof is defined as Max, $\alpha$ is set to a suitable constant (e.g., 0.1) and a threshold value (104) th is set as th=Min+α*(Max−Min), if (focus measure<th), then the points belonging to the base are assumed to be points belonging to the ridge, other than the above. Now, the number of points that belong to the ridge is defined as N. Next, at step 105, the corresponding focus measure at which the number of points N that belong to the ridge reaches the maximum, is selected as the optimum focus measure.

Returning to the description of FIG. 5, the corresponding focus position is estimated using the optimum focus measure selected by the method described with reference to using FIG. 10 (511).

Referring again to FIG. 1, the processing up to the picking up of the low resolution reference image 13 has been described up to now. Next, the stage is moved (14) and a low resolution defect image is picked up similarly (15). Next, a defect position and a focusing partial area are specified from within the low resolution image (16). An objective for setting the focusing partial area is to hold a detection region for focus-position calculation to the required minimum, to thereby shorten the focusing time. The focusing detection region does not need to be identical to a detection region for a high resolution image. The focusing detection region can be limited to a narrower region. On the other hand, however, when the focusing region is made excessively narrow (it is set to one line in an extreme case), the result of calculation of focus measures becomes unstable. It is necessary to set the area of the detection region to a suitable size according to the targets to be detected.

Figure 3:
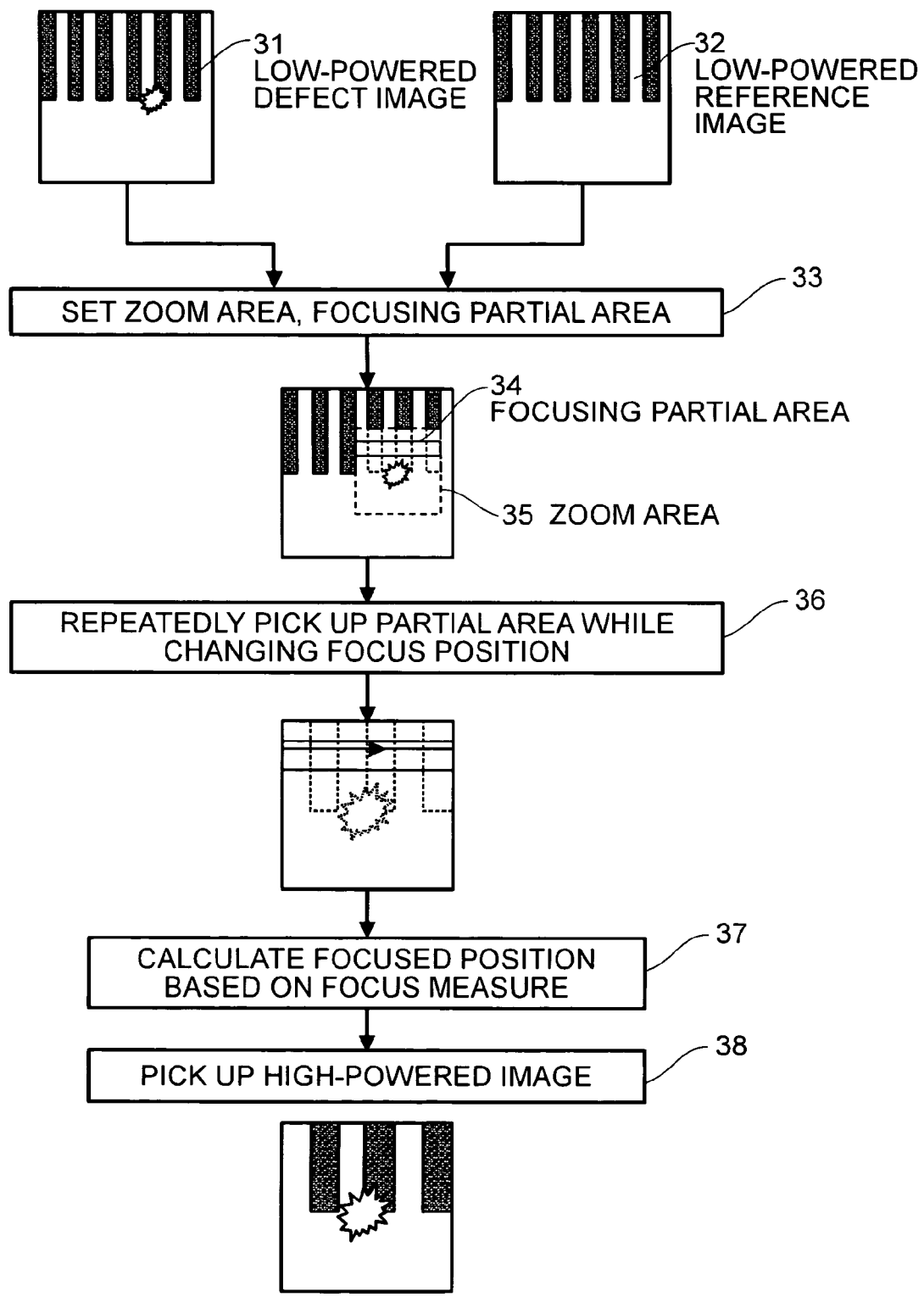
FIG. 3 is a flow diagram showing the flow of a process for setting a focusing partial area.
Figure 4:
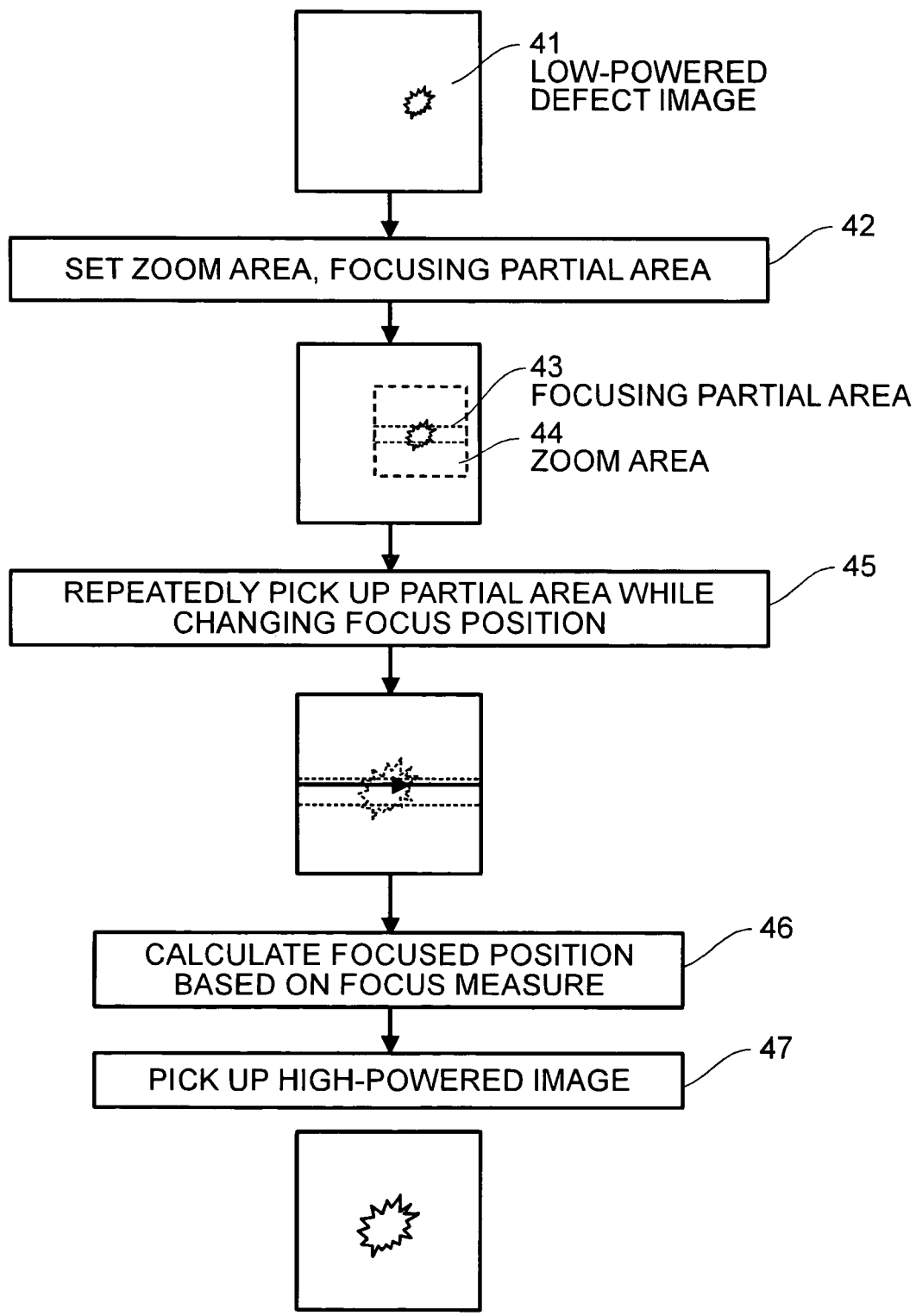
FIG. 4 is a flow diagram showing the flow of a process for setting a focusing partial area.

A method of specifying the focusing partial area will be explained with reference to FIG. 3. FIG. 3 shows, in detail, steps 13 through 17 of the sequence shown in FIG. 1. First, a low resolution defect image 31 and a low resolution reference image 32 are detected. Next, a zoom area 35 imaged at a high resolution is set, and, at the same time, a focusing partial area 34 is set (33).

The zoom area 35 is typically determined as follows: An image corresponding to the difference between the low resolution defect image 31 and the low resolution reference image 32 is created and digitized, and a defect section is manifested. Then, the center of gravity of the digitized region is determined as the position of the center of the defect. Next, the zoom area 35, based on the high resolution image, is set in such a manner that the center of the defect is located at the center of the field of view.

Figure 11:
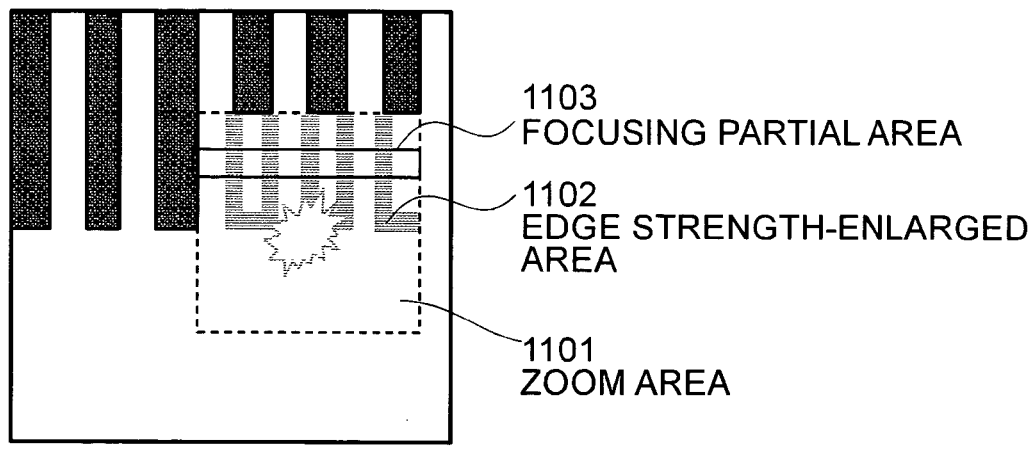
FIG. 11 is a plan view of a specimen which is subjected to a method of setting a focusing partial area.

Further, the focusing partial area 34 is determined using a method shown in FIG. 11, for example. That is, an area, which lies within the zoom area 1101, based on a high resolution image, and has an edge strength greater than or equal to a threshold value, is determined (1102). Next, an area 1103, in which the number of pixels having a high edge strength is at a predetermined number or more, is set as the focusing partial area. A method of setting the focusing partial area does not need to make use of a special method. For example, the number of pixels having a large edge strength may be integrated or added up until the sum total of the numbers of pixels exceeds a predetermined amount (assumed to be an Eth line tentatively) for each line, from a line (assumed to be an Sth line tentatively) lying within the zoom area. An area from the Sth line to the Eth line can be set as the focusing partial area.

Next, only the focusing area is repeatedly imaged while changing the focus position (36). Next, a focus position is calculated (37) and the focus position is aligned with the calculated focus position provided to detect a high resolution image (38).

Referring to the description of FIG. 1 again, the stage is moved (18) and a high resolution reference image is picked up. Prior to the execution of the next defect detection, the result of measurement of the focus position at the defect position detected up to now is reflected on the focus map to update the focus map (110). Thus, the accuracy of estimation of the focus position provided by the focus map is improved.

Figure 6:
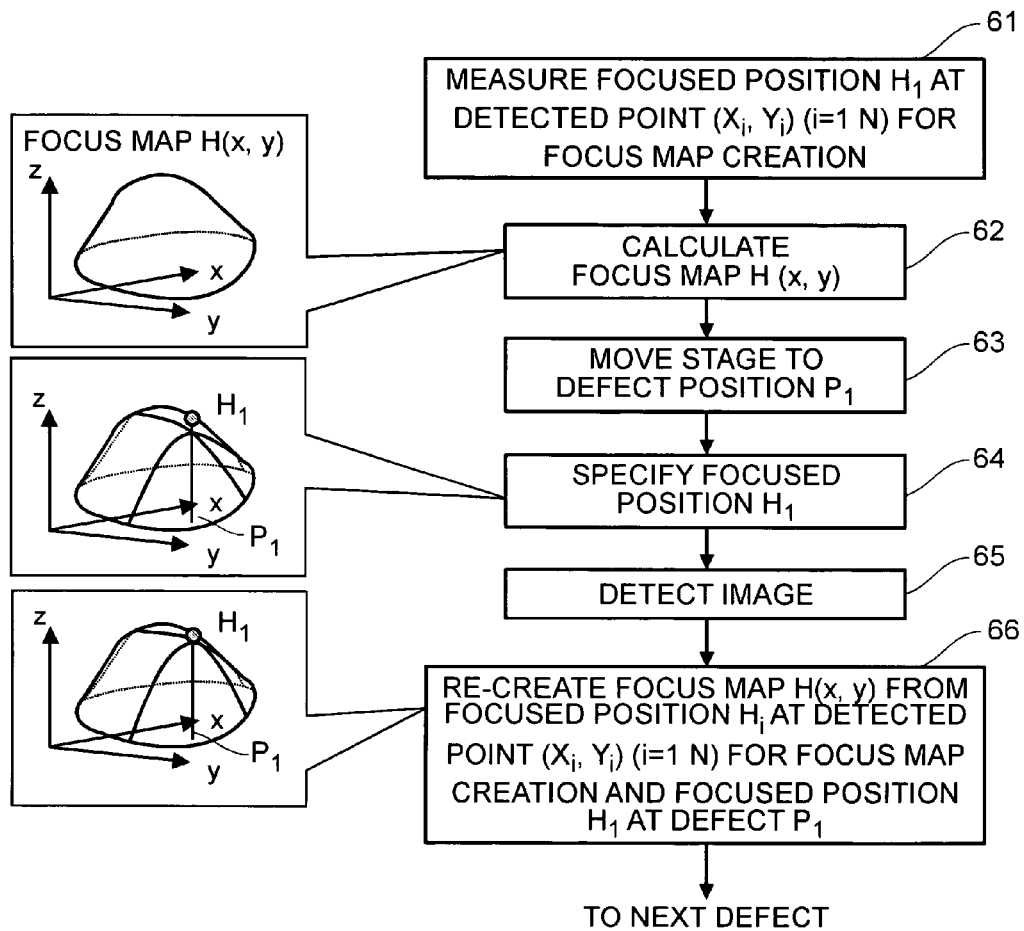
FIG. 6 is a flow diagram showing the flow of processing related to a method of sequentially updating focus maps.

A method of updating or renewing the focus map will be explained with reference to FIG. 6. FIG. 6 shows a sequence obtained by closing up and rewriting a section of the sequence shown in FIG. 1, related to focus map updating in particular, in order to describe the focus map updating method clearly. A focus position at a point $(X_i, Y_i)$ (where i=1, . . . , N) for focus map creation is measured and defined as $H_i$ (61). A model is selected that will make a good approximation of an in-plane distribution at the corresponding focus position. Then, a focus map is calculated from the result of measurement of the focus positions (62). If, for example, the secondary function model expressed in the equation (1) is selected, then such parameters as a, b and c, that cause the square error expressed in the equation (2) to be minimized, can be determined by the least squares method.

Next, the stage is moved to a defect position intended for detection (assumed to be $P_1$ tentatively) (63) to specify a focus position (assumed to be $H_1$ tentatively) (64). Next, various images, such as a low resolution image, a low resolution defect image, etc., are picked up (65). Next, the defect position $P_1$ is added thereto to update the focus map. That is, if the processing is applied to the above-described example, then data concerning the defect position $P_1$ is added, and parameters a, b and c are re-calculated by the least squares method.

If the above-described Steps are repeatedly executed each time the focusing is executed, then the accuracy of estimation of the corresponding focus position by the focus map can be improved during review execution.

Figure 7:
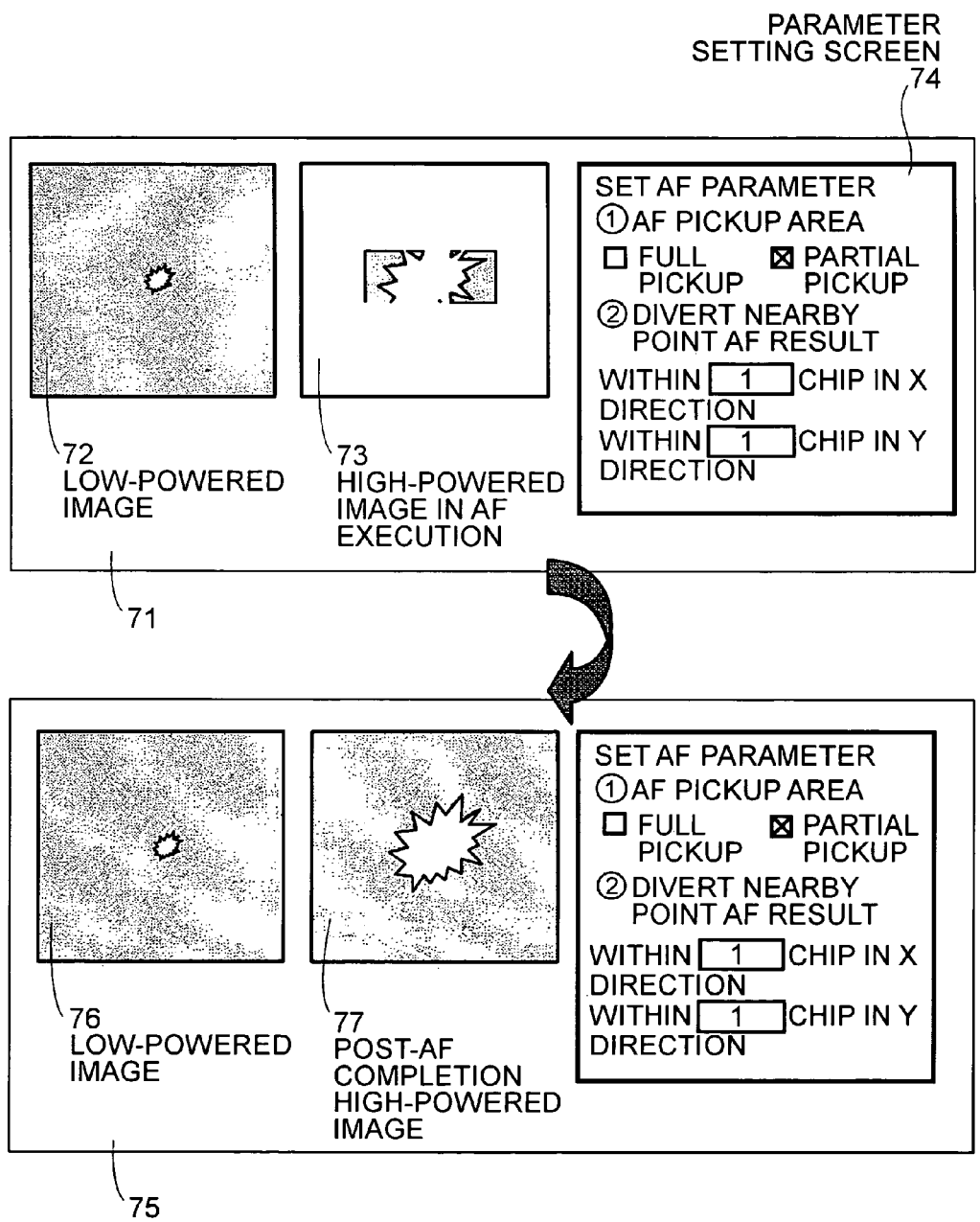
FIG. 7 is a diagram showing the front view of a screen, illustrating a user interface and a parameter setting screen.
Figure 8:
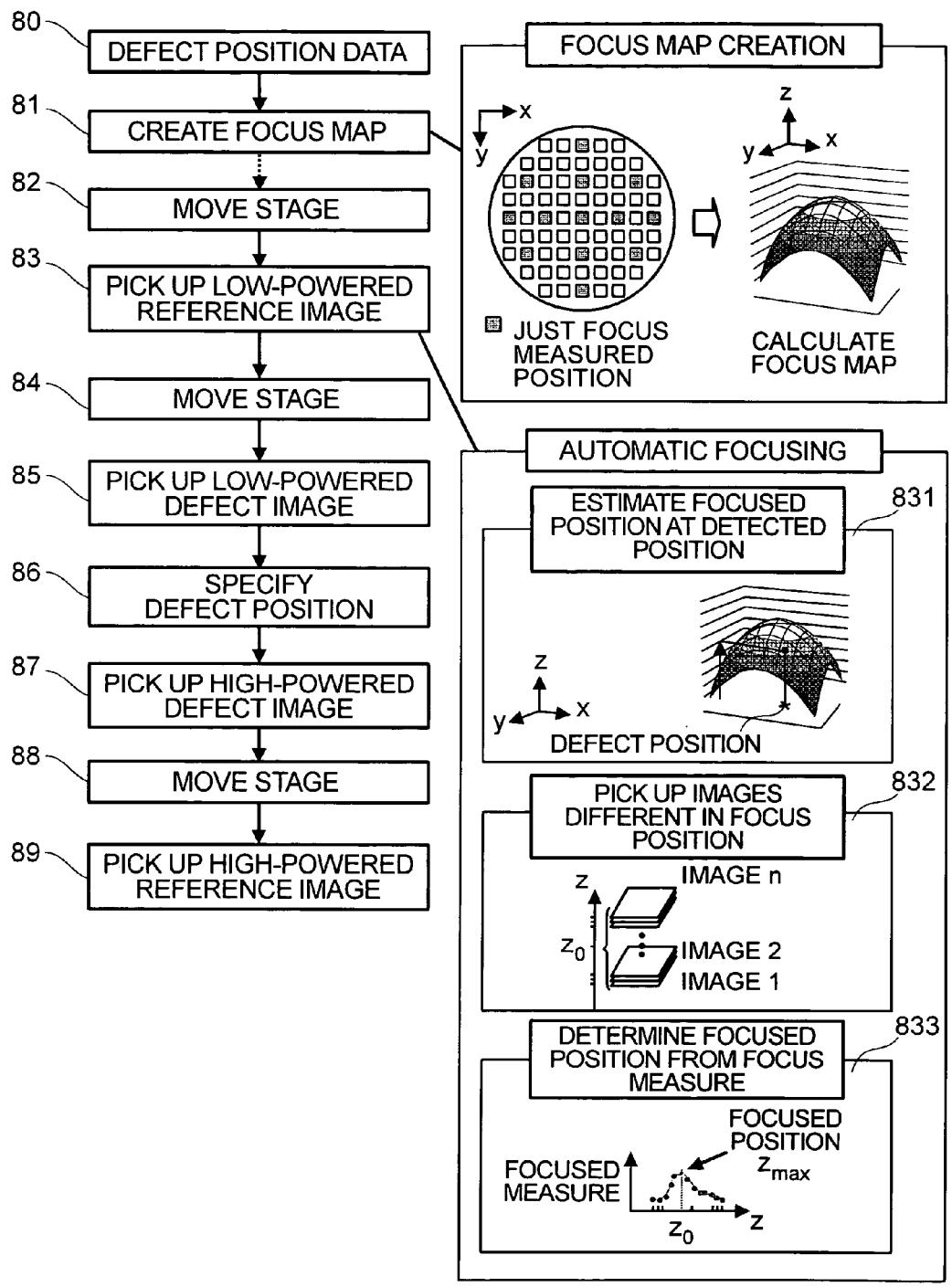
FIG. 8 is a flow diagram showing a known sequence of steps for observing a specimen.

FIG. 7 shows one example of a user interface employed in accordance with the present invention. Reference numeral 71 indicates a screen used for parameter adjustments and operation confirmation related to automatic focusing. A high resolution image 73 produced by execution of Auto Focus (AF) is limited to an area set to the neighborhood of a defect based on a low resolution image 72. A user is able to confirm, using the high resolution image 73 produced by execution of the AF, whether the area used for automatic focusing is properly set. Reference numeral 74 indicates a parameter setting screen. An "AF imaging or pickup area" makes it possible to designate, as a parameter (represented as AF in the figure) for automatic focusing, whether the image pickup area used in automatic focusing should be set as full or partial. A "nearby point AF result diversion" makes it possible to designate, when it is determined whether the execution of AF is necessary, to which extent the AF result at a nearby point should be diverted in X and Y directions. Reference numeral 75 indicates a high resolution image 77, that is picked up after completion of focusing at the time of picking-up the high resolution image, and a set parameter at that time.

The invention may be embodied in other specific forms without departing from the spirit or essential characteristics thereof. The present embodiment is therefore to be considered in all aspects as illustrative and not restrictive, the scope of the invention being indicated by the appended claims rather than by the foregoing description, and all changes which come within the meaning and range of equivalency of the claims are therefore intended to be embraced therein.

What is claimed is:

1. A method of observing a specimen, comprising the steps of:
    imaging the specimen at a low resolution by use of a scanning electron microscope to acquire an image;
    specifying an area for imaging the specimen at a high resolution from the image acquired at the low resolution;
    imaging the specimen at a high resolution by use of the scanning electron microscope to determine a focus position;
    setting a focal point of the scanning electron microscope to the determined focus position; and
    acquiring a high resolution image in the specified area in a state in which the focus position is set to the determine focus position.

2. The method of observing a specimen according to claim 1, wherein in said step of imaging the specimen at a high resolution to determine a focus position, an area high in contrast in the image detected at the low resolution is selected as the area for imaging the specimen at the high resolution.

3. The method of observing a specimen according to claim 1, wherein in said step of imaging the specimen at a high resolution to determine a focused position, a decision is made as to whether an already-detected point, at which a focus position has already been calculated, exists in the vicinity of the area for imaging the specimen at the high resolution, and when an already-detected point exists, a focus position for the area for imaging the specimen at the high resolution is determined based on information about the already calculated focus position at the detected point.

4. A method of observing a specimen, comprising the steps of:
    imaging the specimen at a low resolution by use of a scanning electron microscope to acquire an image;
    specifying a focusing area at the time of imaging the specimen at a high resolution from the image acquired at the low resolution;
    imaging the specified area by use of the scanning electron microscope to determine a focus position;
    setting a focal point of the scanning electron microscope to the determined focus position; and
    acquiring a high resolution image of the specimen by use of the scanning electron microscope in a state in which the focus position is set to the determined focus position.

5. The method of observing a specimen according to claim 4, wherein the specified focusing area and an area in which the high resolution image is acquired, are included in the image obtained by imaging the specimen at the low resolution.

6. A method of observing a specimen, comprising the steps of:
    measuring a focus position of a scanning electron microscope at a plurality of points on the specimen to determine a distribution of focus positions within the plane of the specimen;
    estimating a focus position at a desired observation position on the specimen on the basis of information concerning the determined distribution of focus positions within the plane of the specimen;
    acquiring a plurality of images at different focus positions inclusive of the estimated focus position while changing the focus position of the scanning electron microscope at the desired observation position on the specimen;
    determining the corresponding focus position of the desired observation position from the acquired plural images at the different in focus positions;
    correcting said distribution of focus positions on the basis of information about the determined focus position at the desired observation position; and
    observing the specimen in a state in which the focus position at the desired observation position of the scanning electron microscope is aligned with the determined focus position.

7. The method of observing a specimen according to claim 6, wherein, in said step of determining the distribution of the focus positions within the plane of the specimen, the distribution is determined by an approximation in the form of a curved surface.

* * * * *